(12) United States Patent
Huang et al.

(10) Patent No.: US 7,312,629 B2
(45) Date of Patent: Dec. 25, 2007

(54) PROGRAMMABLE IMPEDANCE CONTROL CIRCUIT CALIBRATED AT VOH, VOL LEVEL

(75) Inventors: Mu-Hsiang Huang, San Jose, CA (US); Katsuya Nakashima, Isahaya (JP); Yoshifumi Miyajima, Nagasaki (JP); Masahiro Ichihashi, Nagasaki (JP)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 52 days.

(21) Appl. No.: 11/436,260

(22) Filed: May 17, 2006

(65) Prior Publication Data

US 2007/0268039 A1    Nov. 22, 2007

(51) Int. Cl.
*H03K 19/003* (2006.01)
(52) U.S. Cl. .......................................... 326/30; 326/31
(58) Field of Classification Search ............. 326/30–33
See application file for complete search history.

(56) References Cited

U.S. PATENT DOCUMENTS

| | | | |
|---|---|---|---|
| 5,666,078 A | 9/1997 | Lamphier et al. | 327/108 |
| 6,525,558 B2 | 2/2003 | Kim et al. | 326/30 |
| 6,541,996 B1 | 4/2003 | Rosefield et al. | 326/30 |
| 6,636,821 B2 | 10/2003 | Lawson | 702/107 |
| 6,653,882 B2 | 11/2003 | Raychaudhuri | 327/270 |
| 6,661,250 B2 | 12/2003 | Kim et al. | 326/30 |
| 6,771,097 B1 | 8/2004 | Poh Ho et al. | 327/108 |
| 6,836,144 B1 * | 12/2004 | Bui et al. | 326/32 |
| 7,253,656 B2 * | 8/2007 | Costa et al. | 326/30 |
| 2005/0088199 A1 | 4/2005 | Bales | 326/30 |

OTHER PUBLICATIONS

Chris Johnson, "Enabling Signal Conditioning Circuitry. Faster memory calls in graphics chips fuel higher performance," Chip Design Magazine, Dec./Jan. 2004, pp. 1-5.
"New Function of DDR2 SDRAM Off-Chip Driver (OCD)," Elpida, Apr. 2007, pp. 1-12.

* cited by examiner

*Primary Examiner*—James H. Cho
(74) *Attorney, Agent, or Firm*—Haverstock & Owens LLP (57) ABSTRACT

A method and apparatus are provided for a programmable impedance control circuit. In one example of the apparatus, a programmable impedance control circuit of an output driver of an input/output interface is provided. The programmable impedance control circuit includes a pull-up impedance programmed according to a multi-stage emulator and a pull-down impedance programmed according to the multi-stage emulator. The multi-stage emulator includes a first stage for calibrating a pull-up PMOS impedance at a voltage level Voh, a second stage for calibrating a pull-up NMOS impedance at a voltage level Vol, a third stage for calibrating a pull-down NMOS impedance at the voltage level Vol, a fourth stage for re-calibrating the pull-up NMOS impedance at the voltage level Vol, and fifth stage for calibrating a pull-down PMOS impedance at the voltage level Voh.

45 Claims, 5 Drawing Sheets

PROGRAMMABLE IMPEDANCE CONTROL CIRCUIT CALIBRATED AT VOH, VOL LEVEL

FIELD OF THE INVENTION

The present invention relates to terminated input/output interfaces. More particularly, the present invention relates to controlling transmission line integrity of terminated input/output interfaces.

BACKGROUND OF THE INVENTION

For high-speed integrated circuit devices, transmission line effect cannot be ignored. To achieve better signal integrity, output drivers should generally have a fixed resistance value under different process, temperature and voltage (PVT) variations. Metal oxide semiconductor (MOS) devices are usually adopted for driver implementation.

Figure 1:
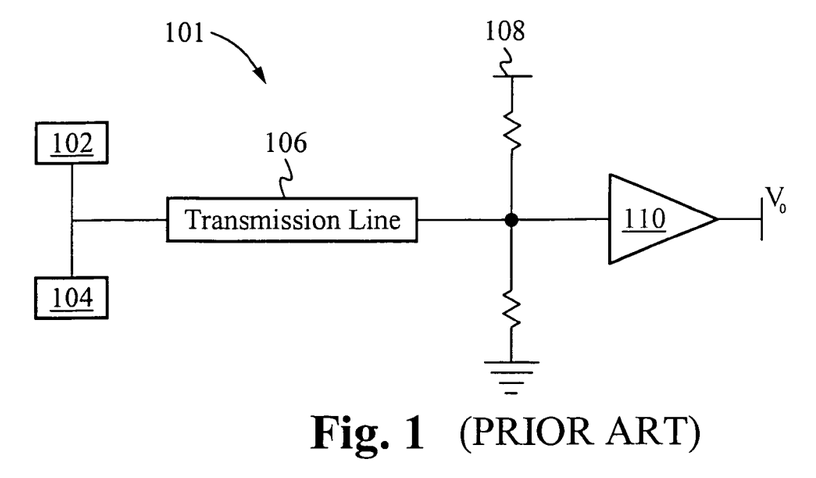
FIG. 1 shows an output driver of a terminated input/output (I/O) interface.

FIG. 1 shows an output driver 101 of a terminated input/output (I/O) interface. The output driver 101 includes a transmission line 106, input termination impedance control for the pull-up device 102, input termination impedance control for the pull-down device 104, a terminated control connection 108 and a receiver 110. The output voltage Vo will also be referred to as the output voltage Vddq. In a conventional output driver 101, one type of MOS device is typically used for the pull-up device 102, and one type of MOS device is typically used for the pull-down device 104. For example, a positive channel MOS (PMOS) device is typically used for the pull-up device 102, and a negative channel MOS (NMOS) device is typically used for the pull-down device 104.

Figure 4:
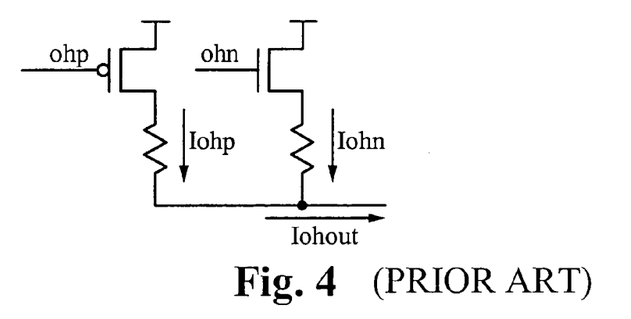
FIG. 4 shows a simplified ideal output device having pull-up and pull-down circuitry.

FIG. 4 shows a simplified ideal output device having pull-up and pull-down circuitry. This simplified output device includes a PMOS device ohp and an NMOS device ohn. The PMOS device ohp and the NMOS device ohn ideally have linear impedance characteristics of resistors. The PMOS device ohp has an output current Iohp. The NMOS device has an output current Iohn. The summation of these currents is the output current Iohout. A conventional output device has an array of these PMOS and NMOS pairs. The pull-up device 102 is ideally calibrated at the midpoint of the voltage Vddq with PMOS devices. Accordingly, each PMOS device would have a corresponding NMOS device. The PMOS devices are used to calibrate the pull-up device 102 at the Vddq midpoint. The NMOS devices are used to calibrate the pull-down device 104 at the Vddq midpoint.

Figure 5:
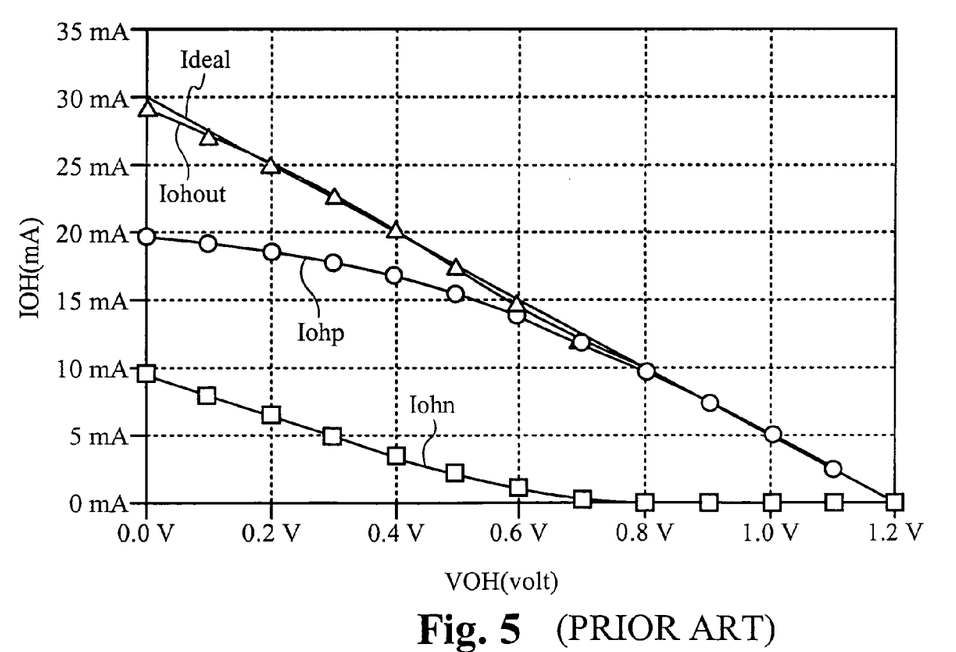
FIG. 5 is a graph showing the behavior of the currents of the simplified ideal output driver of FIG. 4.

FIG. 5 is a graph showing the behavior of the currents of the simplified ideal output driver of FIG. 4. The graph includes PMOS statistical data for the current Iohp, NMOS statistical data for the current Iohn, the actual output current Iohout, and the ideal output current Ideal. The graph shows the relationship between the output current Ioh, on the vertical axis, and the output voltage Voh, on the horizontal axis. The output current Iohout is a summation of the PMOS statistical data for the current Iohp and the NMOS statistical data for the current Iohn. Ideally, the summation of the currents Iohp and Iohn is a straight line, as shown by the ideal output current Ideal. The actual output current Iohout is relatively close to being ideal.

Figure 2:
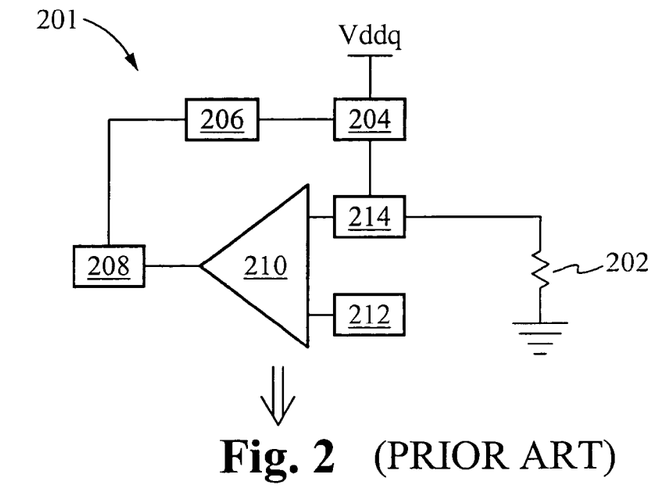
FIG. 2 shows a conventional impedance control circuit for calibrating the proper pull-up for a conventional output driver.

FIG. 2 shows a conventional impedance control circuit 201 for calibrating the proper pull-up for a conventional output driver. An external resistor 202 coupled to the chip determines the value of the output driver impedance. A pull-up impedance emulator 204 is placed in the impedance control circuit 201 to emulate the output driver electrical characteristics. The control circuit 201 includes a certain amount of chip impedance error 214 between the pull-up impedance emulator 204 and the external resistor 202.

The pull-up impedance emulator 204 is typically scaled down to a certain ratio to form a proper voltage divider with the external resistor 202. The pull-up impedance emulator includes fingers, or an array, of PMOS devices, which can each be enabled or disabled. The comparator 210 compares the impedance of the pull-up impedance emulator 204 with the external resistor 202. The impedance control circuit 201 either turns on more fingers or fewer fingers until the transistors' impedance reaches the required accuracy. The control circuit 201 uses a counter 206 to count the proper number of MOS device fingers to turn on. The control circuit 201 then generates a binary code 208 for use in the output driver. A comparator 210 registers the result for use in the output driver.

The external resistor 202 is usually 5 times the impedance of the required output driver impedance. Accordingly, the pull-up impedance emulator 204 is usually set to one-fifth (⅕) the size of the output driver. This setting is ideal for an impedance calibrated at the Vddq midpoint 212. The impedance emulator 204 is compared to the voltage Vddq midpoint 212, in other words, Vddq/2. In FIG. 2, the impedance emulator emulates the impedance of the pull-up of the output driver for proper calibration.

Figure 3:
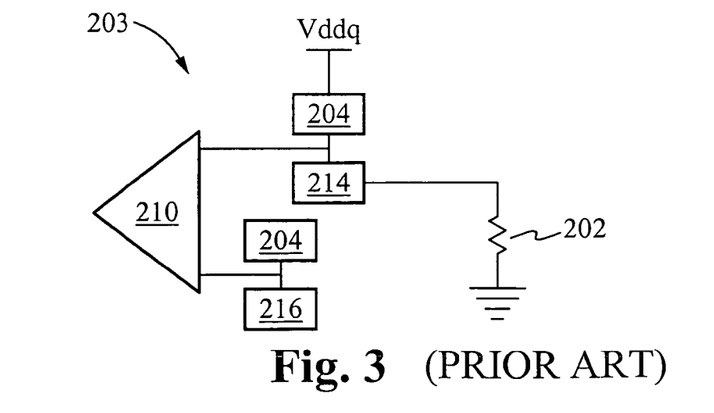
FIG. 3 is a conventional impedance control circuit for calibrating the proper pull-down for the conventional output driver.

FIG. 3 is a conventional impedance control circuit 203 for calibrating the proper pull-down for the conventional output driver. The comparator 210 compares a pull-down impedance emulator 216 to the pull-up impedance emulator 204. It is known that the pull-up impedance emulator 204 is calibrated at the Vddq midpoint 212, that the conventional output driver PMOS devices are used for the pull-up device 102, and that NMOS devices are used for the pull-down device 104. Accordingly, the pull-down impedance emulator 216 will also be calibrated to the voltage Vddq midpoint 212 to balance the calibration of the pull-up impedance. Note that the chip impedance error 214 becomes part of the comparison and that the pull-down 216 is calibrated accordingly.

Unfortunately, using PMOS devices only for pull-up or NMOS devices only for pull-down cannot serve the purpose of achieving better signal integrity because PMOS devices and NMOS devices show different impedances under different bias conditions. Thus, for an output driver 101, the output voltage level will not stay at the voltage level Vddq/Ground.

Figure 6:
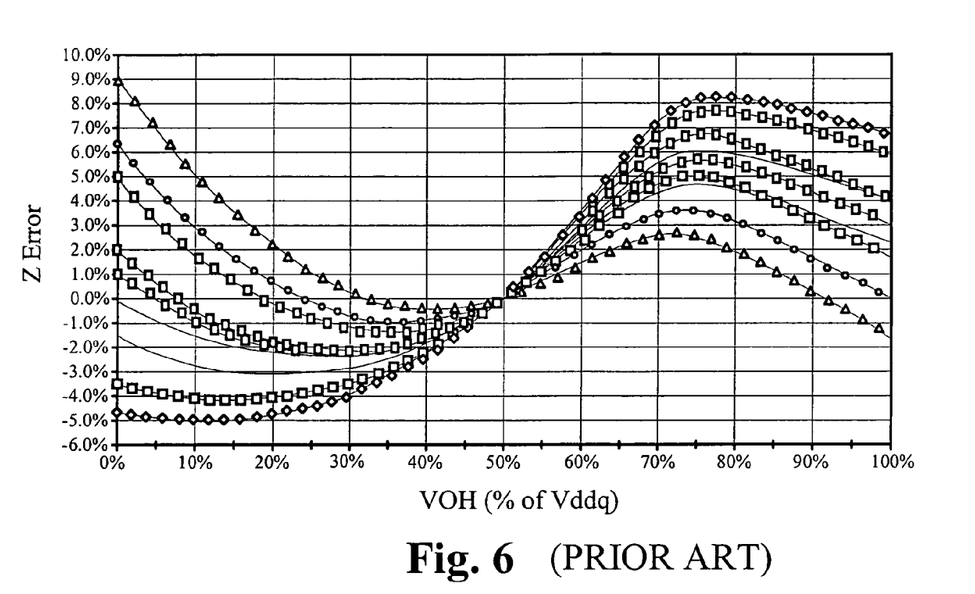
FIG. 6 is a graph of the relationship between the impedance (Z) error and the output voltage Voh.

FIG. 6 is a graph of the relationship between the impedance (Z) error, on the vertical axis, and the output voltage Voh, on the horizontal axis. This graph provides statistical information of an output driver having pull-up and pull-down devices calibrated at the voltage Vddq midpoint, in other words, the voltage level Vddq/2. As shown in FIG. 6, when the output driver impedance is calibrated at the voltage Vddq midpoint, the output voltage Voh can exhibit an undue amount of error in the output driver circuitry. In other words, the output driver is only accurate when the output level is near 50% of the voltage Vddq, midway between pull-up and pull-down. Because the output voltage level does not stay at the voltage level Vddq/Ground, a conventional output driver calibrated at the voltage Vddq midpoint will exhibit an undue amount of error much of the time.

SUMMARY OF THE INVENTION

What is needed is an improved system having features for addressing the problems mentioned above and new features not yet discussed. Broadly speaking, a programmable impedance control circuit is provided. It should be appreciated that the present invention can be implemented in numerous ways, including as a method, a process, an apparatus, a system or a device. Inventive embodiments of the present invention are summarized below.

In one embodiment, a method is provided for calibrating an impedance of an output driver having an external resistor that affects the impedance of the output driver. The method comprises calibrating a pull-up PMOS impedance at a voltage level Voh, calibrating a pull-up NMOS impedance at a voltage level Vol, calibrating a pull-down NMOS impedance at the voltage level Vol, re-calibrating the pull-up NMOS impedance at the voltage level Vol, and calibrating a pull-down PMOS impedance at the voltage level Voh.

In another embodiment, a programmable impedance control circuit of an output driver having an external resistor that affects the impedance of the output driver is provided. The programmable impedance control circuit comprises a pull-up impedance programmed according to a multi-stage emulator and a pull-down impedance programmed according to the multi-stage emulator. The multi-stage emulator comprises a first stage for calibrating a pull-up PMOS impedance at a voltage level Voh, a second stage for calibrating a pull-up NMOS impedance at a voltage level Vol, a third stage for calibrating a pull-down NMOS impedance at the voltage level Vol, a fourth stage for re-calibrating the pull-up NMOS impedance at the voltage level Vol, and fifth stage for calibrating a pull-down PMOS impedance at the voltage level Voh.

In yet another embodiment, a multi-stage configured to calibrate an impedance of an output driver having an external resistor that affects the impedance of the output driver is provided. The multi-stage impedance emulator comprises a first stage for calibrating a pull-up PMOS device impedance at a voltage level Voh, a second stage for calibrating a pull-up NMOS device impedance at a voltage level Vol, a third stage for calibrating a pull-down NMOS device impedance at the voltage level Vol, a fourth stage for re-calibrating the pull-up NMOS device impedance at the voltage level Vol, and a fifth stage for calibrating a pull-down PMOS device impedance at the voltage level Voh.

The invention encompasses other embodiments configured as set forth above and with other features and alternatives.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENT(S)

A programmable impedance control circuit calibrated at the voltage Voh, Vol level is disclosed. Numerous specific details are set forth in order to provide a thorough understanding of the present invention. It will be understood, however, to one skilled in the art, that the present invention may be practiced with other specific details.

A new programmable impedance control circuit is provided that calibrates an output driver impedance at the voltage Voh, Vol level instead of at one point at fifty percent (50%) of the voltage Vddq. For a terminated input/output (I/O) interface, driver characteristics at the voltage Voh, Vol level are much more important than at the midpoint of the voltage Vddq. The new design provides an efficient way to calibrate output driver impedance to achieve accurate driver impedance under different process, voltage and temperature (PVT) conditions.

For a terminated I/O interface, the output level does not stay at the voltage level Vddq/Ground, but rather at approximately eighty percent (80%) of the voltage Vddq and approximately 20 percent (20%) of the voltage Vddq, depending on the ratio of impedance between the driver and the termination. Output driver impedance at fifty percent (50%) of the voltage Vddq has more effect on the data transition between a High voltage and a Low voltage. However, impedance at the voltage Voh, Vol level represents the source termination impedance, which should match the transmission line impedance to minimize reflection. From the linearity point of view, it would be more accurate to calibrate impedance at two points close to the voltage Voh, Vol level, rather than just calibrate at one single midpoint of the voltage Vddq. Thus, a carefully selected combination of PMOS devices, NMOS devices and poly resistors are used in the new design to achieve the linearity needed for applications in which the output driver undergoes varying bias conditions.

The output driver usually includes fingers (or an array) of MOS devices. The fingers comprise the carefully selected combination of PMOS devices and NMOS devices. Each finger of the driver is enabled or disabled to achieve the required impedance under different process, voltage and temperature conditions. More transistors will turn on if the current impedance is higher than a target value. Fewer transistors will turn on if current impedance is lower than the target value. Accordingly, an impedance control circuit is required to determine the correct number of finger combinations for the output driver. This binary code is referred to as the binary ZQ code. For the driver comprised of both PMOS devices and NMOS devices for pull-up and pull-down devices, four sets of ZQ codes are needed to identify the correct number of fingers to turn on. The four sets of ZQ codes include pull-up P code, pull-up N code, pull-down N code and pull-down P code.

Figure 8:
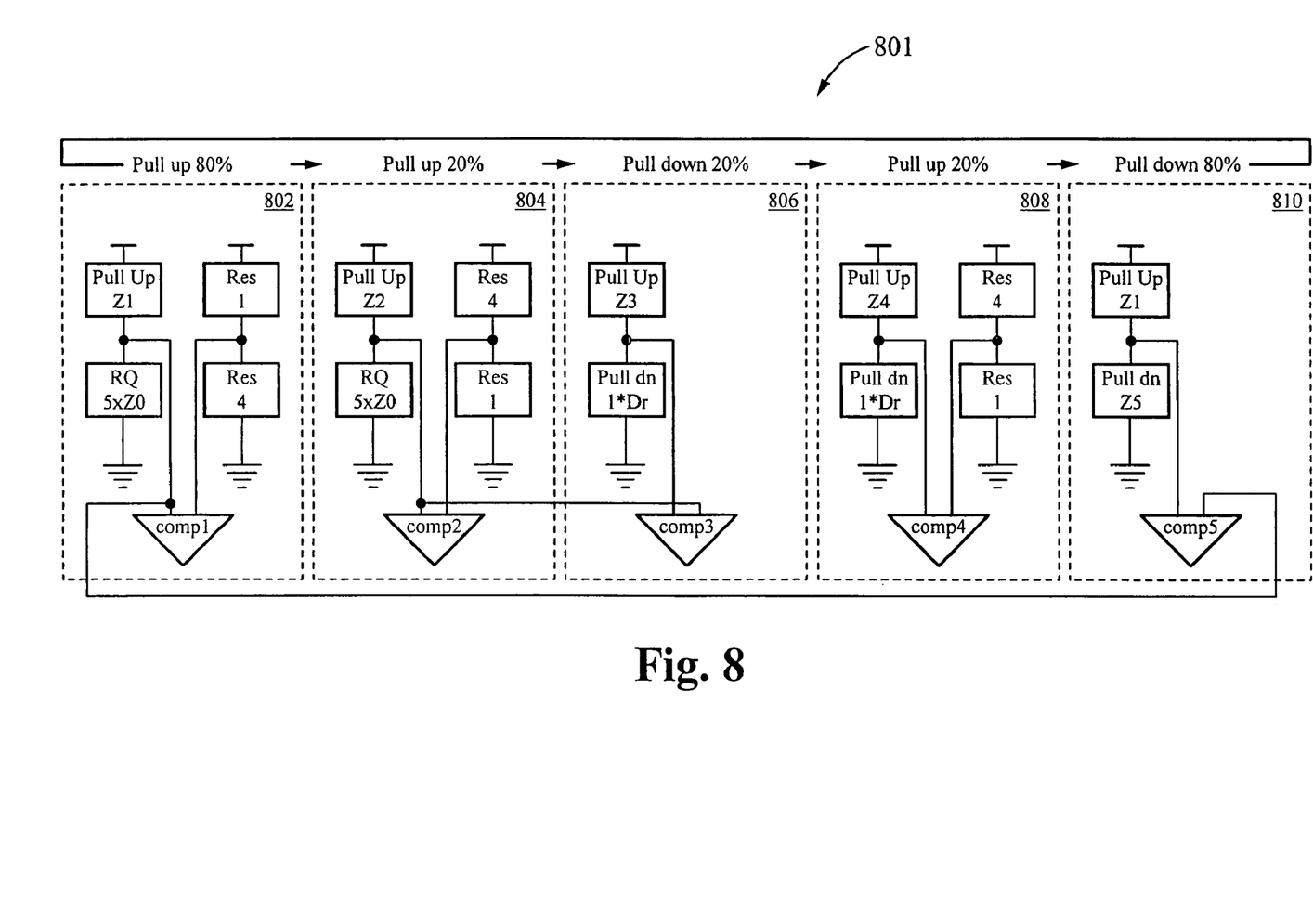
FIG. 8 is a multiple-stage impedance emulator and comparator of the output driver, in accordance with an embodiment.

FIG. 8 is a multiple-stage impedance emulator and comparator of the output driver, in accordance with an embodiment. Such an impedance emulator is placed in the impedance control circuit to emulate the output driver electrical characteristics. An external resistor RQ coupled to the chip (not shown) determines the value of the driver impedance. The multiple-stage impedance emulator is scaled to a certain ratio to form a proper voltage divider with the external resistor. By comparing the emulators' impedance with the external resistor RQ, impedance control circuitry either turns on more fingers or fewer fingers until the impedance of the combination of transistors reaches the required accuracy.

The multiple-stage impedance emulator and comparator carries a method for determining the proper combination of transistors for the impedance control circuitry. Recall that for a conventional output driver, the external resistor is usually five times the impedance of the required output driver impedance. For such a device, impedance emulators are usually one-fifth (⅕) the size of the output drivers. Such a setup would be ideal for impedance calibrated at the voltage Vddq midpoint.

However, values will necessarily be different if the impedance at the voltage Voh, Vol level is to be calibrated. For a fixed resistance RQ value, the output driver only changes the impedance of the emulators to approach the voltage level of the reference voltage. Assume a voltage level Voh equals X times the voltage Vddq, where X is a variable; to calibrate the pull-up device at this point, the impedance of the emulators needs to be five times (1−X)/X multiplied by the output driver impedance. Assuming a voltage level Vol equals (1−X) multiplied by the voltage Vddq, the impedance of the emulator needs to be five times X/(1−X) multiplied by the output driver impedance. In order to achieve the required linearity and accuracy, the multiple-stage impedance emulator carries out a five-stage method to obtain the correct impedance arrangement of the PMOS transistor and NMOS transistor combination.

The first stage 802 is to calibrate a pull-up PMOS device impedance at a voltage Voh level, which is preferably approximately eighty percent (80%) of the voltage Vddq. At the voltage Voh level, the NMOS device current of a pull-up device can be ignored because the NMOS device is almost in the off mode. Accordingly, the first stage involves comparing the level of a reference voltage to get the pull-up PMOS code. The pull-up PMOS device code can be obtained by proper setting of the pull-up PMOS device impedance emulator Z1. As shown in FIG. 8, the resistance RQ equals five times the impedance Z0, where the impedance Z0 is equivalent to the output driver impedance. The resistor Res1 is one-fourth (¼) of the resistor Res4. In other words, the resistor Res4 is approximately eighty percent (80%) of the reference impedance used for comparison. Accordingly, the ratio of the impedance Z1 to the resistance RQ equals approximately one to four (1 to 4), where the resistance RQ is the impedance of the external resistor of the output driver. Also, four (4) times the impedance Z1 equals the resistance RQ, which means four (4) times the impedance Z1 equals five (5) times the impedance Z0. Accordingly, the impedance Z1 equals five-fourths (⁵⁄₄) times the impedance Z0. The comparator Comp1 carries out the comparison of these impedances and generates the appropriate pull-up PMOS device code.

The second stage 804 involves using the already known pull-up PMOS device code to calibrate the pull-up NMOS device impedance at a voltage Vol level, which is preferably approximately twenty percent (20%) of the voltage Vddq. At this stage, both the PMOS device and NMOS device are on. Accordingly, the known pull-up PMOS device code is used to set the pull-up NMOS device impedance emulator Z2, which will be modified in a later stage into a more accurate impedance. The resistor Res4 is four (4) times the impedance of the resistor Res1. In other words, the resistor Res4 is preferably approximately 20% of the reference impedance used for comparison. Accordingly, the ratio of the impedance Z2 to the resistance RQ equals four to one (4 to 1). Also, the impedance Z2 equals four (4) times the resistance RQ. Accordingly, the impedance Z2 equals four (4) times five (5) multiplied by the impedance Z0. In other words, the impedance Z2 equals twenty (20) times the impedance Z0. The comparator Comp2 carries out the comparison of these impedances and generates a preliminary pull-up NMOS device code. Note that because the impedance Z2 equals twenty (20) times the impedance Z0, this pull-up NMOS device impedance Z2 will have some accuracy issues because the impedance Z2 is so relatively small compared to the impedance Z0. The impedance Z2 will be modified in a later stage for more accuracy.

After the combination of the pull-up PMOS device and the pull-up NMOS device is known, the multiple-stage impedance emulator 801 will use another copy of these impedance emulators to calibrate pull-down devices. In this manner, the impedance of the pull-down device is compared directly with the external resistor RQ without introducing the error accumulated from the pull-up calibration.

The third stage 806 involves calibrating a pull-down NMOS device impedance at a voltage Vol level, which is preferably approximately twenty percent (20%) Vddq. This pull-down NMOS device impedance emulator is calibrated at an enhanced resolution because the multiple-stage impedance emulator will use this pull-down impedance emulator to re-calibrate the pull-up PMOS device in the fourth stage 808. The pull-up NMOS device impedance Z3 is compared with the impedance Z0. The ratio of the impedance Z3 to the impedance Z0 is four to one (4 to 1). In other words, the impedance Z3 equals four (4) times the impedance Z0. Also, the impedance Z3 equals one-fifth (⅕) the impedance Z2. The comparator Comp3 carries out the comparison and generates the pull-down NMOS device code. During the second stage 804, recall that the ratio of pull-up PMOS device impedance emulators to the output driver impedance is one to twenty (1 to 20) when X equals eighty percent (80%). The impedance accuracy here is dubious when the transistor impedances are so relatively small.

Accordingly, the fourth stage 808 involves re-calibrating the pull-up PMOS device impedance at a voltage Vol level, which is preferably approximately twenty percent (20%) of the voltage Vddq level. The pull-down NMOS device impedance Z0 is compared to the impedance Z4 instead of compared to the resistance RQ. Higher accuracy is achieved this way. The ratio of the impedance Z4 to the impedance Z0 is four to one (4 to 1). Accordingly, the impedance Z4 equals four (4) times the impedance Z0. The comparator Comp4 carries out the comparison of the impedances and generates the pull-up PMOS device code.

The fifth stage 810 involves calibrating a pull-down PMOS device impedance at a voltage Voh level, which is preferably approximately eighty percent (80%) of the voltage Vddq. The ratio of the impedance Z1 to the resistance RQ equals the ratio of the impedance Z1 to the impedance Z5. Accordingly, the resistance RQ multiplied by the impedance Z1 equals the impedance Z1 multiplied by the impedance Z5, which means the impedance Z5 equals the resistance RQ. Accordingly, the impedance Z5 equals five (5) times the impedance Z0. The comparator Comp5 carries out the comparison and generates the pull-down PMOS device code.

The multiple-stage impedance emulator 801 registers all four (4) sets of binary codes, and the binary codes are sent for programming into the output driver. The output driver is thereby preferably calibrated at approximately eighty percent (80%) of the voltage Vddq and approximately twenty percent (20%) of the voltage Vddq. The output driver is a programmable impedance control circuit programmed according to the multiple-stage impedance emulator 801. Note that the multiple-stage impedance emulator 801 shows five (5) stages. However, the multiple-stage impedance emulator may include more or fewer stages depending on the required accuracy of the impedances of the output driver.

Figure 9:
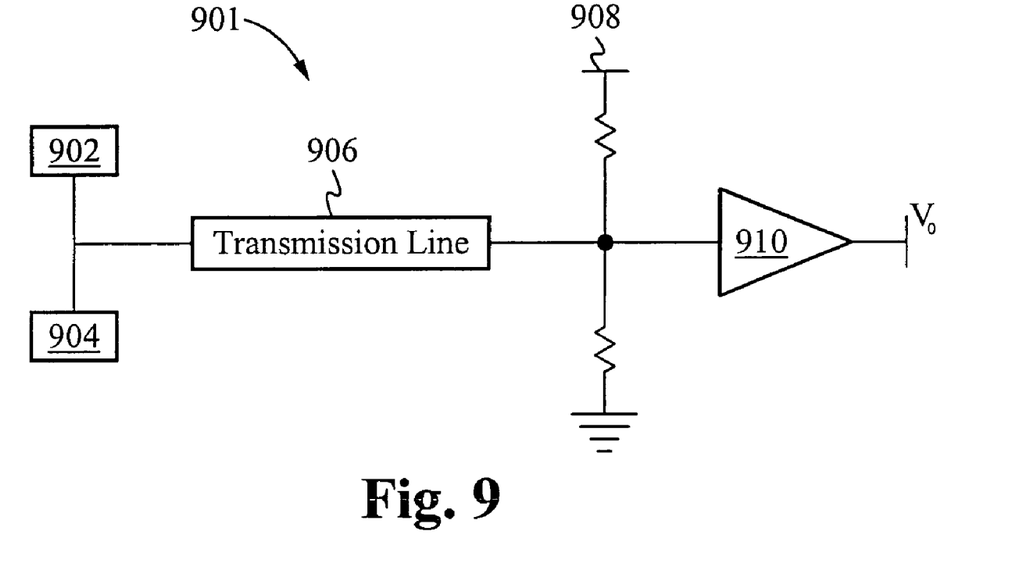
FIG. 9 shows an output driver of a terminated input/output (I/O) interface, in accordance with an embodiment.

FIG. 9 shows an output driver 901 of a terminated input/output (I/O) interface, in accordance with an embodiment. The output driver 901 includes programmable impedance control circuitry, including input termination impedance control circuitry for a pull-up device 902 and input termination impedance control circuitry for a pull-down device 904. The output driver 901 also includes a transmission line 906, a terminated control connection 908 and a receiver 910. The output voltage V0 is also referred to as the voltage Vddq. The pull-up device 902 is calibrated according to the multi-stage impedance emulator 801 and programmed into the output driver 901. The pull-down device 904 is also calibrated according to the multi-stage impedance emulator 801 and programmed into the output driver 901.

Figure 7:
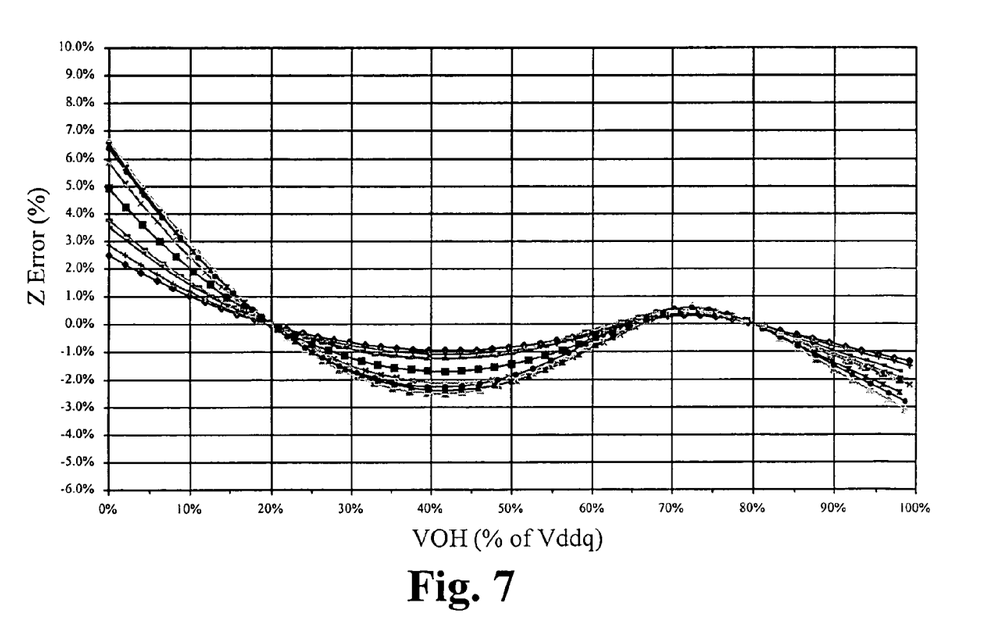
FIG. 7 is a graph of the relationship between the impedance (Z) error and the output voltage Voh of an output driver calibrated with the multi-stage impedance emulator, in accordance with an embodiment.

FIG. 7 is a graph illustrating the relationship between the impedance (Z) error and an output voltage Voh of an output driver calibrated with the multi-stage impedance emulator 801, in accordance with an embodiment. This graph provides statistical information of an output driver having a pull-up device and a pull-down device calibrated at a voltage Voh, which is preferably approximately eighty percent (80%) of the voltage Vddq, and at a voltage Vol, which is preferably approximately twenty percent (20%) of the voltage Vddq.

Advantageously, as shown in FIG. 7, when the output driver impedance is calibrated at a voltage Voh and a voltage Vol, the output voltage exhibits a relatively low error percentage in the output driver circuitry. In other words, the output driver is accurate at more output voltage levels, unlike the output driver of FIG. 6, which was only accurate when the output level was near fifty percent (50%) of the voltage Vddq. Because a real life output voltage level does not stay at the voltage Vddq/Ground, an output driver calibrated according to the multi-stage impedance emulator 801 will exhibit a substantially less amount of error much of the time. Further, it is known that the impedance error will be substantially zero when the output voltage is at a voltage Vol or a voltage Voh.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of calibrating an impedance of an output driver having an external resistor that affects the impedance of the output driver, the method comprising:
    calibrating a pull-up PMOS device impedance at a voltage level Voh;
    calibrating a pull-up NMOS device impedance at a voltage level Vol;
    calibrating a pull-down NMOS device impedance at the voltage level Vol;
    re-calibrating the pull-up NMOS device impedance at the voltage level Vol; and
    calibrating a pull-down PMOS device impedance at the voltage level Voh.

2. The method of claim 1, wherein voltage Voh is approximately eighty percent (80%) of a voltage Vddq, wherein the voltage Vddq is equivalent to an output voltage of the output driver.

3. The method of claim 1, wherein voltage Vol is approximately twenty percent (20%) of a voltage Vddq, wherein the voltage Vddq is equivalent to an output voltage of the output driver.

4. The method of claim 1, wherein calibrating the pull-up PMOS device impedance at the voltage level Voh comprises:
    arranging a first reference impedance and a second reference impedance into a first ratio of 1 to 4;
    arranging a pull-up PMOS device impedance emulator and the external resistor into a second ratio; and
    comparing the first ratio to the second ratio.

5. The method of claim 4, wherein the external resistor is 5 times an output impedance of the output driver.

6. The method of claim 4, wherein calibrating the pull-up PMOS device impedance at the voltage level Voh comprises generating a binary code indicating a proper number of PMOS device transistors to turn on to calibrate the PMOS device transistors at the voltage level Voh of the output driver.

7. The method of claim 6, further comprising programming into the output driver the binary code indicating a proper number of PMOS device transistors to turn oil to calibrate the PMOS device transistors at the voltage level Voh of the output driver.

8. The method of claim 4, wherein calibrating the pull-down PMOS device impedance at the voltage level Voh comprises:
    arranging the pull-up PMOS device impedance emulator and the external resistor into a first ratio;
    arranging the pull-up PMOS device impedance emulator and a pull-down PMOS device impedance emulator into a second ratio; and
    comparing the first ratio to the second ratio.

9. The method of claim 8, wherein the external resistor is five times an output impedance of the output driver.

10. The method of claim 8, wherein calibrating the pull-down PMOS device impedance at the voltage level Voh comprises generating a binary code indicating a proper number of PMOS device transistors to turn on to calibrate the PMOS device transistors at the voltage level Voh of the output driver.

11. The method of claim 10, further comprising programming into the output driver the binary code indicating the proper number of PMOS device transistors to turn on to calibrate the PMOS device transistors at the voltage level Voh of the output driver.

12. The method of claim 1, wherein calibrating the pull-up NMOS device impedance at the voltage level Vol comprises:
    arranging a first reference impedance and a second reference impedance into a first ratio of 4 to 1;
    arranging a pull-up NMOS device impedance emulator and the external resistor into a second ratio; and
    comparing the first ratio to the second ratio.

13. The method of claim 12, wherein the external resistor is five times an output impedance of the output driver.

14. The method of claim 12, wherein calibrating the pull-up NMOS device impedance at the voltage level Vol comprises generating a binary code indicating a proper number of NMOS device transistors to turn on to calibrate the NMOS device transistors at the voltage level Vol of the output driver.

15. The method of claim 1, further comprising programming into the output driver the binary code indicating a proper number of NMOS device transistors to turn on to calibrate the NMOS device transistors at the voltage level Vol of the output driver.

16. The method of claim 15, further comprising programming into the output driver the binary code indicating a proper number of NMOS device transistors to turn on to calibrate the NMOS device transistors at the voltage level Vol of the output driver.

17. The method of claim 1, wherein calibrating the pull-down NMOS device impedance at the voltage level Vol comprises:
arranging a first reference impedance and a second reference impedance into a first ratio of 4 to 1;
arranging a pull-up NMOS device impedance emulator and an output driver impedance into a second ratio; and
comparing the first ratio to the second ratio.

18. The method of claim 17, wherein the external resistor is five times an output impedance of the output driver.

19. The method of claim 17, wherein calibrating the pull-down NMOS device impedance at the voltage level Vol comprises generating a binary code indicating a proper number of NMOS device transistors to turn on to calibrate the NMOS device transistors at the voltage level Vol of the output driver.

20. The method of claim 1, further comprising programming into the output driver the binary code indicating a proper number of NMOS device transistors to turn on to calibrate the NMOS device transistors at the voltage level Vol of the output driver.

21. The method of claim 20, further comprising programming into the output driver the binary code indicating a proper number of NMOS device transistors to turn on to calibrate the NMOS device transistors at the voltage level Vol of the output driver.

22. The method of claim 1, wherein re-calibrating the pull-up NMOS device impedance at the voltage level Vol comprises:
arranging a first reference impedance and a second reference impedance into a first ratio of 4 to 1;
arranging a pull-up PMOS device impedance emulator and an output driver impedance into a second ratio; and
comparing the first ratio to the second ratio.

23. The method of claim 22, wherein the external resistor is five times an output impedance of the output driver.

24. The method of claim 22, wherein calibrating the pull-up PMOS device impedance at the voltage level Vol comprises generating a binary code indicating a proper number of PMOS device transistors to turn on to calibrate the PMOS device transistors at the voltage level Vol of the output driver.

25. The method of claim 24, further comprising programming into the output driver the binary code indicating a proper number of PMOS device transistors to turn on to calibrate the PMOS device transistors at the voltage level Vol of the output driver.

26. The method of claim 1, further comprising:
generating a first binary code indicating a proper number of PMOS device transistors to turn on in a PMOS device calibrated at the voltage level Voh of the output driver;
generating a second binary code indicating a proper number of NMOS device transistors to turn on in an NMOS device calibrated at the voltage level Vol of the output driver;
generating a third binary code indicating a proper number of NMOS device transistors to turn on in an NMOS device calibrated at the voltage level Vol of the output driver; and
generating a fourth binary code indicating a proper number of PMOS device transistors to turn on in a PMOS device calibrated at the voltage level Voh of the output driver.

27. The method of claim 26, further comprising:
programming the first binary code into a pull-up impedance of the output driver;
programming the second binary code into the pull-up impedance of the output driver;
programming the third binary code into a pull-down impedance of the output driver; and
programming the fourth binary code into the pull-down impedance of the output driver.

28. A programmable impedance control circuit of an output driver having an external resistor that affects the impedance of the output driver, the programmable impedance control circuit comprising:
a pull-up impedance programmed according to a multi-stage emulator; and
a pull-down impedance programmed according to the multi-stage impedance emulator, wherein the multi-stage emulator comprises a first stage for calibrating a pull-up PMOS device impedance at a voltage level Voh, a second stage for calibrating a pull-up NMOS device impedance at a voltage level Vol, a third stage for calibrating a pull-down NMOS device impedance at the voltage level Vol, a fourth stage for re-calibrating the pull-up NMOS device impedance at the voltage level Vol, and a fifth stage for calibrating a pull-down PMOS device impedance at the voltage level Voh.

29. The programmable impedance control circuit of claim 28, wherein the voltage level Voh is approximately eighty percent (80%) of a voltage Vddq, wherein the voltage Vddq is equivalent to an output voltage of the output driver.

30. The programmable impedance control circuit of claim 28, wherein voltage Vol is approximately twenty percent (20%) of a voltage Vddq, wherein the voltage Vddq is equivalent to an output voltage of the output driver.

31. The programmable impedance control circuit of claim 28, wherein calibrating the pull-up PMOS device impedance at the voltage level Voh comprises:
arranging a first reference impedance and a second reference impedance into a first ratio of 1 to 4;
arranging a pull-up PMOS device impedance emulator and the external resistor into a second ratio; and
comparing the first ratio to the second ratio.

32. The programmable impedance control circuit of claim 31, wherein calibrating the pull-down PMOS device impedance at the voltage level Voh comprises:
arranging the pull-up PMOS device impedance emulator and the external resistor into a first ratio;
arranging the pull-up PMOS device impedance emulator and a pull-down PMOS device impedance emulator into a second ratio; and
comparing the first ratio to the second ratio.

33. The programmable impedance control circuit of claim 28, wherein calibrating the pull-up NMOS device impedance at the voltage level Vol comprises:

arranging a first reference impedance and a second reference impedance into a first ratio of 4 to 1;
arranging a pull-up NMOS device impedance emulator and the external resistor into a second ratio; and
comparing the first ratio to the second ratio.

34. The programmable impedance control circuit of claim 28, wherein calibrating the pull-down NMOS device impedance at the voltage level Vol comprises:
arranging a first reference impedance and a second reference impedance into a first ratio of 4 to 1;
arranging a pull-up NMOS device impedance emulator and an output driver impedance into a second ratio; and
comparing the first ratio to the second ratio.

35. The programmable impedance control circuit of claim 28, wherein re-calibrating the pull-up NMOS device impedance at the voltage level Vol comprises:
arranging a first reference impedance and a second reference impedance into a first ratio of 4 to 1;
arranging a pull-up PMOS device impedance emulator and an output driver impedance into a second ratio; and
comparing the first ratio to the second ratio.

36. The programmable impedance control circuit of claim 28, wherein the multi-stage emulator comprises further comprises:
a first comparator configured to generate a first binary code indicating a proper number of PMOS device transistors to turn on in a PMOS device calibrated at the voltage level Voh of the output driver;
a second comparator configured to generate a second binary code indicating a proper number of NMOS device transistors to turn on in an NMOS device calibrated at the voltage level Vol of the output driver;
a third comparator configured to generate a third binary code indicating a proper number of NMOS device transistors to turn on in an NMOS device calibrated at the voltage level Vol of the output driver; and
a fourth comparator configured to generate a fourth binary code indicating a proper number of PMOS device transistors to turn on in a PMOS device calibrated at the voltage level Voh of the output driver.

37. A multi-stage impedance emulator configured to calibrate an impedance of an output driver having an external resistor that affects the impedance of the output driver, the multi-stage impedance emulator comprising:
a first stage for calibrating a pull-up PMOS device impedance at a voltage level Voh;
a second stage for calibrating a pull-up NMOS device impedance at a voltage level Vol;
a third stage for calibrating a pull-down NMOS device impedance at the voltage level Vol;
a fourth stage for re-calibrating the pull-up NMOS device impedance at the voltage level Vol; and
a fifth stage for calibrating a pull-down PMOS device impedance at the voltage level Voh.

38. The multi-stage impedance emulator of claim 37, wherein voltage Voh is approximately eighty percent (80%) of a voltage Vddq, wherein the voltage Vddq is equivalent to an output voltage of the output driver.

39. The multi-stage impedance emulator of claim 37, wherein voltage Vol is approximately twenty percent (20%) of a voltage Vddq, wherein the voltage Vddq is equivalent to an output voltage of the output driver.

40. The multi-stage impedance emulator of claim 37, wherein calibrating the pull-up PMOS device impedance at the voltage level Voh comprises:
arranging a first reference impedance and a second reference impedance into a first ratio of 1 to 4;
arranging a pull-up PMOS device impedance emulator and the external resistor into a second ratio; and
comparing the first ratio to the second ratio.

41. The multi-stage impedance emulator of claim 40, wherein calibrating the pull-down PMOS device impedance at the voltage level Voh comprises:
arranging the pull-up PMOS device impedance emulator and the external resistor into a first ratio;
arranging the pull-up PMOS device impedance emulator and a pull-down PMOS device impedance emulator into a second ratio; and
comparing the first ratio to the second ratio.

42. The multi-stage impedance emulator of claim 37, wherein calibrating the pull-up NMOS device impedance at the voltage level Vol comprises:
arranging a first reference impedance and a second reference impedance into a first ratio of 4 to 1;
arranging a pull-up NMOS device impedance emulator and the external resistor into a second ratio; and
comparing the first ratio to the second ratio.

43. The multi-stage impedance emulator of claim 37, wherein calibrating the pull-down NMOS device impedance at the voltage level Vol comprises:
arranging a first reference impedance and a second reference impedance into a first ratio of 4 to 1;
arranging a pull-up NMOS device impedance emulator and an output driver impedance into a second ratio; and
comparing the first ratio to the second ratio.

44. The multi-stage impedance emulator of claim 37, wherein re-calibrating the pull-up NMOS device impedance at the voltage level Vol comprises:
arranging a first reference impedance and a second reference impedance into a first ratio of 4 to 1;
arranging a pull-up PMOS device impedance emulator and an output driver impedance into a second ratio; and
comparing the first ratio to the second ratio.

45. The multi-stage impedance emulator of claim 37, further comprising:
a first comparator configured to generate a first binary code indicating a proper number of PMOS device transistors to turn on in a PMOS device calibrated at the voltage level Voh of the output driver;
a second comparator configured to generate a second binary code indicating a proper number of NMOS device transistors to turn on in an NMOS device calibrated at the voltage level Vol of the output driver;
a third comparator configured to generate a third binary code indicating a proper number of NMOS device transistors to turn on in an NMOS device calibrated at the voltage level Vol of the output driver; and
a fourth comparator configured to generate a fourth binary code indicating a proper number of PMOS device transistors to turn on in a PMOS device calibrated at the voltage level Voh of the output driver.

* * * * *